(12) United States Patent
Kuo et al.

(10) Patent No.: US 7,462,055 B2
(45) Date of Patent: Dec. 9, 2008

(54) CIRCUIT BOARD FIXING STRUCTURE

(75) Inventors: Peter Kuo, Tu-Cheng (TW); Bing Du, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/080,464

(22) Filed: Apr. 3, 2008

(65) Prior Publication Data

US 2008/0248679 A1 Oct. 9, 2008

(30) Foreign Application Priority Data

Apr. 4, 2007 (CN) .................... 2007 2 0036365 U

(51) Int. Cl.
*H01R 13/62* (2006.01)
(52) U.S. Cl. .................... 439/330; 361/759; 174/138 G
(58) Field of Classification Search ................ 439/330, 439/326, 331; 361/759; 174/138 G
See application file for complete search history.

(56) References Cited

U.S. PATENT DOCUMENTS

| | | | | |
|---|---|---|---|---|
| 4,692,571 A * | 9/1987 | Trinh et al. | ................ | 200/5 A |
| 5,911,329 A * | 6/1999 | Wark et al. | ................ | 211/41.17 |
| 6,493,233 B1 | 12/2002 | De Lorenzo et al. | | |
| 6,530,798 B1 * | 3/2003 | Li et al. | ...................... | 439/342 |
| 6,695,629 B1 | 2/2004 | Mayer | | |
| 6,785,146 B2 * | 8/2004 | Koike et al. | ................. | 361/759 |
| 6,875,022 B2 * | 4/2005 | Ma | .............................. | 439/41 |
| 7,070,427 B2 * | 7/2006 | Liao et al. | .................... | 439/135 |
| 7,081,015 B2 * | 7/2006 | Jeon | .......................... | 439/569 |
| 7,245,496 B1 * | 7/2007 | Luo et al. | .................... | 361/742 |
| 7,264,487 B2 * | 9/2007 | Liao | ............................ | 439/135 |
| 2004/0166710 A1 * | 8/2004 | Ma | ............................. | 439/135 |
| 2004/0178974 A1 * | 9/2004 | Miller et al. | .................. | 345/82 |
| 2004/0266247 A1 * | 12/2004 | Laio | ............................ | 439/342 |

* cited by examiner

*Primary Examiner*—Neil Abrams
*Assistant Examiner*—Phuong Nguyen
(74) *Attorney, Agent, or Firm*—Wei Te Chung

(57) ABSTRACT

A circuit board fixing structure (100) includes a base (3) and a circuit board (2). The base has a plurality of elastic claws (32) and the elastic claws vertically extend from the base. Each elastic claw includes a fastening portion (34), which forms a fastening surface (36) facing to a top surface of the base. The circuit board is encircled by the elastic claws and an upper surface of the circuit board confronts the fastening surface of the fastening portion.

12 Claims, 2 Drawing Sheets

CIRCUIT BOARD FIXING STRUCTURE

BACKGROUND OF THE INVENTION

1. Field of the Invention

The present invention relates generally to circuit board fixing structures, and more particularly to a fixing structure for a circuit board of an electronic device.

2. Description of Related Arts

As the technology advances, electronic devices such as desktop computers, laptop computers and services have played an important role in daily life. Each electronic device is provided with a circuit board (or a motherboard) fixed to a housing of the electronic device. Various ways of fixing the circuit board to the electronic device are available and cause different effects on the circuit board.

One of conventional methods is that a housing of an electronic device is formed with a plurality of carried pads thereon, wherein each of the carried pads has a blind hole. A circuit board has a plurality of openings corresponding to the blind holes of the carried pads and is placed on the carried pads. The circuit board is fixed to the housing of the electronic device by a plurality of coupling members such as screws inserted into the openings and the blind holes. To fix the above circuit board to the housing of the electronic device needs a screwdriver or a similar tool to screw the coupling members, which is rather troublesome and time-consuming to implement. If a force for screwing the coupling members is not proper, the circuit board may be damaged by the coupling members. Moreover, since the coupling members are often made of metallic material having electrical conductivity, a signal interference is existed with the circuit board.

A non-reversible method for fixing a circuit board to an electronic device is to use sticky substance. When the circuit board or some component of the electronic device has some blemish, it is difficult to remove the blemished member and the whole circuit board is broken and useless.

A third fixing method is shown in a circuit board fixing structure comprising a carrier for carrying a circuit board formed with a plurality of through holes, a pillar penetrating one of the through holes and a stud with a handler portion. The pillar has a first opening and a second opening corresponding to the first opening. A user holds the handler portion of the stud and let the stud penetrate the first and second openings, the stud fixes the circuit board on the carrier. However, too many components and too many steps increase the cost of the product. Furthermore, the stud of this circuit board fixing structure maybe fall off from the pillar, and as a result, a fixing effect can't be achieved Hence, an improved circuit board fixing structure is desired.

SUMMARY OF THE INVENTION

Accordingly, an object of the present invention is to provide a circuit board fixing structure in which a circuit board is easily assembled and tightly fixed.

To achieve the above object, A circuit board fixing structure includes a base and a circuit board. The base has a plurality of elastic claws and the elastic claws vertically extend from the base. Each elastic claw includes a fastening portion, which forms a fastening surface facing to a top surface of the base. The circuit board with edges is encircled by the elastic claws and an upper surface of the circuit board confronts the fastening surface of the fastening portion.

Other objects, advantages and novel features of the invention will become more apparent from the following detailed description when taken in conjunction with the accompanying drawings.

DETAILED DESCRIPTION OF THE PREFERRED EMBODIMENT

Figure 1:
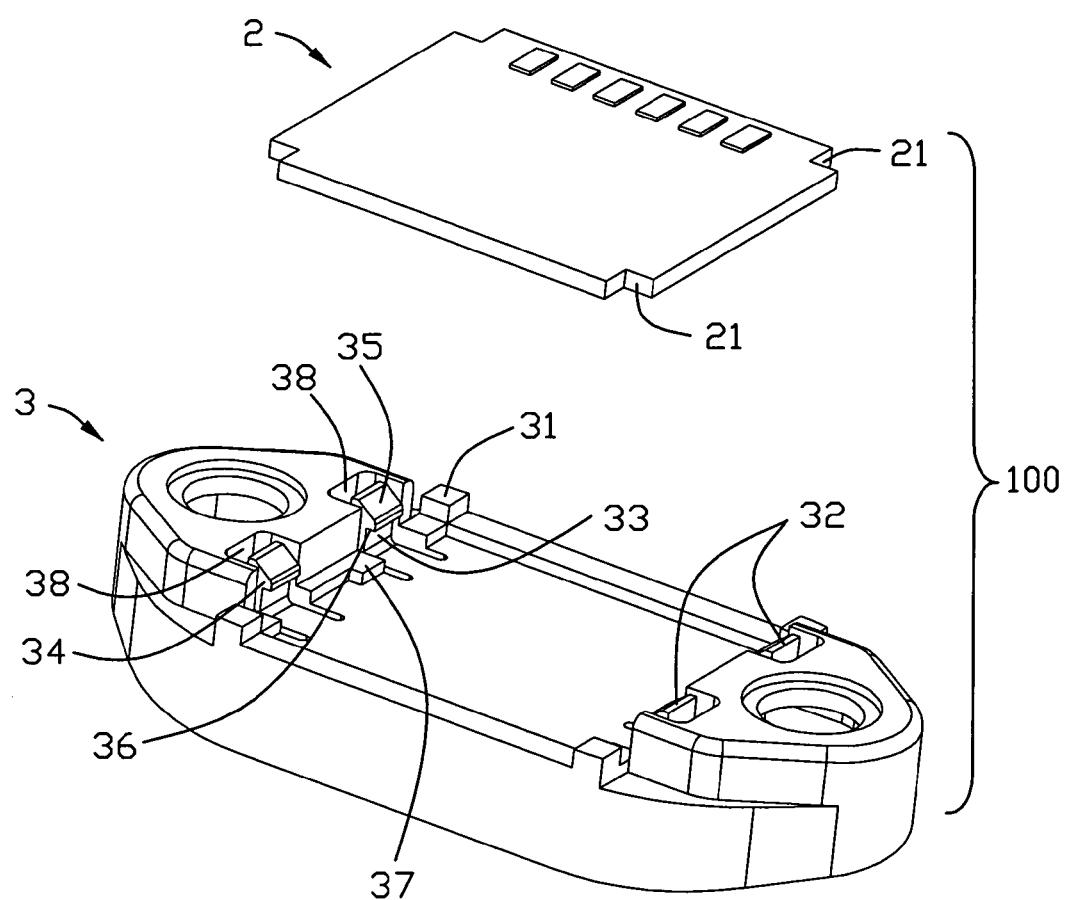
FIG. 1 is a perspective, exploded view of a circuit board fixing structure according to this invention.
Figure 2:
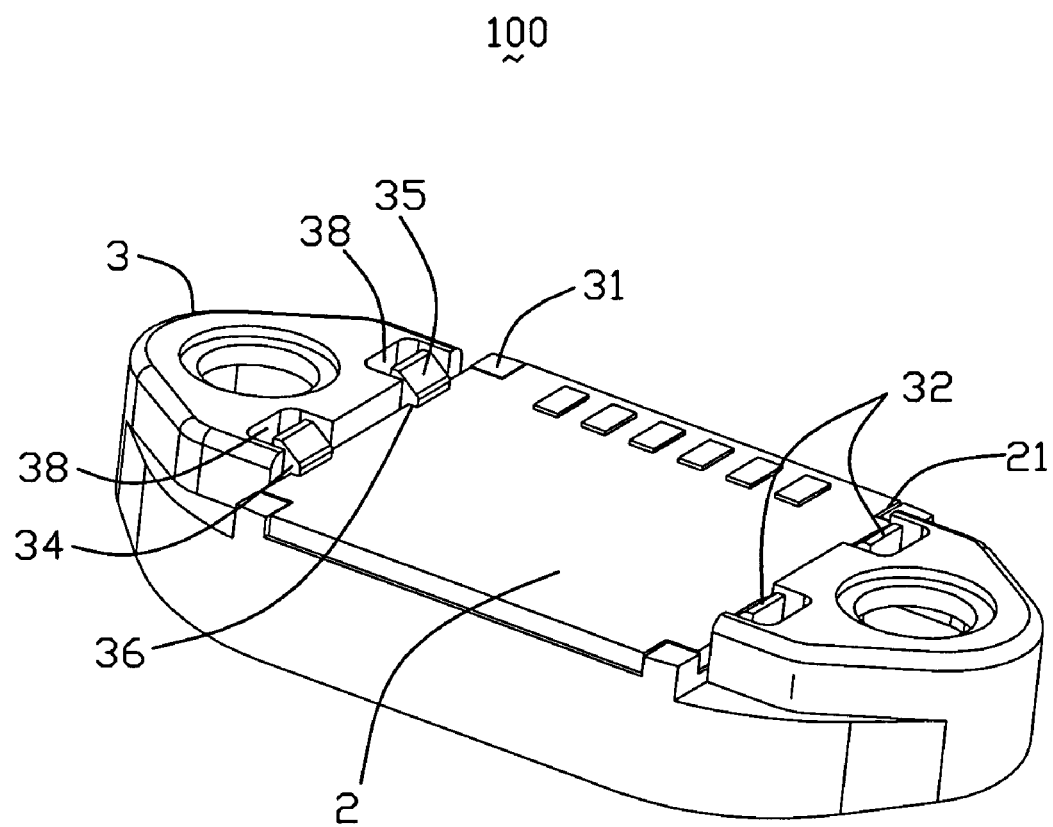
FIG. 2 is a perspective, assembled view of the circuit board fixing structure.

Referring to FIGS. 1 and 2, an embodiment is shown. A circuit board fixing structure 100 comprises a circuit board 2 and a base 3 on which the circuit board 2 is mounted. The circuit board 2 is approximately shaped as a quadrangle taken from a top view, but the four angles thereof recess to be four cutouts 21. The base 3 comprises four blocks 31 corresponding to the four cutouts 21 of the circuit board 2 and two pairs of elastic claws 32 locating at two opposite sides and facing to each other. The blocks 31 are used for limiting a movement of the circuit board 2 in a horizontal direction and the elastic claws 32 are used for limiting a movement of the circuit board 2 in a vertical direction. Each elastic claw 32, extending from an upper surface (not labeled) of the base 3, comprises a supporting bar 33 and a fastening portion 34. The supporting bar 33 is flexible and can endure a small deflection. The fastening portion 34, extending from a distal end of the supporting bar 33, forms a fastening surface 36 with a downward exposure and an inclined surface 35 for guiding the circuit board 2 when the circuit board 2 is assembled onto the base 3. Generally speaking, the claw 32 looks like an approximate "P" from a front-to-back direction. The base 3 further comprises a pair of crutch surfaces 37 lying on the upper surface thereof and having upward exposures. One baffle 38 is situated a little distance behind each of the elastic claw 32 for allowing the elastic claw 32 to deflect from an original position but not deflect so deeply. At first, the elastic claws 32 keep in its original position. When the circuit board 2 moves downward under a guidance of the inclined surfaces 35, a force is pressed on the inclined surfaces 35 and causes a deflection of the supporting bars 33 towards the baffles 38, accordingly, the circuit board 2 continues to go under the fastening surfaces 36, and then, the elastic claws 32 resume to the original direction, and the circuit board 2 is sandwiched between the fastening surfaces 36 and the crutch surfaces 37 ultimately. In fact, the number of the cutouts 21 of the circuit board 2 and the number of the corresponding blocks 31 of the base 3 are not limited to be four, that is to say, we are looking forward to limit the horizontal movement of the circuit board 2, and hence, whether the number of the blocks 31 of the base 3 is four or not is not important. For example, if a hole is existed the circuit board 2, just only one hole corresponding to the block 31 also can retain the circuit board 2. Moreover, the number of the edges and the number of the angles of the circuit board 2 are both not limited to be four.

In a second embodiment not shown in FIGS. 1-2, the circuit board fixing structure 100 lacks the cutouts 21 of the polygonal circuit board 2 and the corresponding blocks 31 of the base 3 of the first embodiment, and at least one elastic claw 32 is mated with each edge of the circuit board 2 for providing a limitation of a horizontal movement of the circuit board 2 and also a limitation of a vertical movement of the circuit board 2 relative to the base 3. One elastic claw 32 of the base 3 corresponding to one edge of the circuit board 2 is the best in this embodiment, but in practice, users can reduce some elastic claws 32 for simplification.

In a third embodiment similar to the second embodiment, at least one elastic claw 32 is mated with each angle of the circuit board 2, which can also achieve a limitation of a horizontal movement of the circuit board 2 and a limitation of a vertical movement of the circuit board 2. In this embodiment, users can also reduce some elastic claws 32 for simplification.

In a fourth embodiment, the circuit board 2 comprises the cutouts 21 and the base 3 comprises elastic claws 32 mating with the cutouts 21. The supporting bar 33 of the base 3 completely and fully mates with the cutout 21 for providing the limitation of a horizontal movement of the circuit board 2 and the fastening surface 36 confronts an upper surface (not labeled) of the circuit board 2 for providing the limitation of a vertical movement of the circuit board 2.

In this circuit board fixing structure 100, when a user assembles the circuit board 2 onto the base 3, the circuit board 2 moves downward under a guidance of the inclined surfaces 35 and a force is pressed on the inclined surfaces 35 to cause a deflection of the elastic claws 32 and the circuit board 2 to be sandwiched between the fastening surfaces 36 and the crutch surfaces 37 ultimately. It makes the assembling of the circuit board 2 on the base 3 simple and it avoids the circuit board 2 from being destroyed during the assembling process.

While a preferred embodiment in accordance with the present invention has been shown and described, equivalent modifications and changes known to persons skilled in the art according to the spirit of the present invention are considered within the scope of the present invention as described in the appended claims.

We claim:

1. A circuit board fixing structure for an electronic device, comprising:
    a base having a plurality of elastic claws vertically extending from the base, each elastic claw comprising a supporting bar and a fastening portion; the supporting bar is flexible and can endure a small deflection; the fastening portion extending from a distal end thereof for guiding the circuit board when the circuit board is assembled onto the base;
    a circuit board encircled by the elastic claws and having an upper surface confronting the fastening surfaces;
    the elastic claws are used for limiting a movement of a circuit board in a vertical direction;
    wherein the circuit board comprises a plurality of cutouts and the base comprises a plurality of blocks corresponding to the cutouts; the blocks are used for limiting a movement of the circuit board in a horizontal direction;
    the base comprises crutch surfaces extending therefrom and the circuit board is sandwiched between the fastening surfaces and the crutch surfaces; one baffle is situated a little distance behind each of the elastic claw for allowing the elastic claw to deflect from an original position but not deflect so deeply.

2. The circuit board fixing structure as described in claim 1, wherein; the fastening portion with a fastening surface facing to a top surface of the base.

3. The circuit board fixing structure as described in claim 1, the elastic claws mate with the edges of the circuit board.

4. The circuit board fixing structure as described in claim 1, wherein the elastic claws mate with the angles of the circuit board.

5. The circuit board fixing structure as described in claim 4, wherein the angles of the circuit board recess forming the cutouts and the elastic claw comprises the flexible supporting bar mating with each of the cutouts.

6. The circuit board fixing structure as described in claim 1, wherein; the blocks are four alignment protrusions upward extending at four corner of the said printed circuit board loading area on the base.

7. The circuit board fixing structure as described in claim 6, wherein the fastening portion comprises an inclined surface located above the fastening surface.

8. The circuit board fixing structure as described in claim 7, wherein; the circuit board moved downward by a pressing force along with the inclined surface of the fastening portion.

9. The circuit board fixing structure as described in claim 8, wherein; four protrusions extending vertically from the base and coplanar with the crutch surfaces.

10. A printed circuit board assembly for an electronic device comprising:
    a base defining a printed circuit board loading area with a pair of latch structures on two opposite sides of said area; the plurality of latch structures vertically extending from the base, each latch structure comprising a supporting bar and a fastening portion; the supporting bar is flexible and can endure a small deflection; the fastening portion extending from a distal end thereof for guiding the circuit board when the circuit board is assembled onto the base; a restriction area is located behind the latch structures to prevent over deflecting of the latch structures;
    a plurality of standoff structures formed on an upper face of a boundary of the base; and
    four alignment protrusions upward extending at four corner of the said printed circuit board loading area on the base, the alignment protrusions are used for limiting a movement of the circuit board in a horizontal direction; and
    a printed circuit board configured to be compliantly disposed upon the printed circuit board loading area under a condition that two opposite end edges are locked by said latch structures, four edges of said printed circuit board are seated upon the corresponding standoffs, and four cutouts are respectively located at the four corners of the printed circuit board, the four cutouts are received on the corresponding alignment protrusions, respectively;
    the circuit board is sandwiched between the fastening portions and the standoffs.

11. The printed circuit board assembly as claimed in claim 10, wherein a longitudinal edge region of said printed circuit board between said pair of latch structures is equipped with conductive pads thereon.

12. The printed circuit board assembly as claimed in claim 10, wherein the printed circuit board is dimensioned similar to the printed circuit board loading area.

\* \* \* \* \*